US007028285B2

(12) United States Patent
Côté et al.

(10) Patent No.: US 7,028,285 B2
(45) Date of Patent: Apr. 11, 2006

(54) STANDARD CELL DESIGN INCORPORATING PHASE INFORMATION

(75) Inventors: Michel L. Côté, San Jose, CA (US); Christophe Pierrat, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 496 days.

(21) Appl. No.: 10/165,557

(22) Filed: Jun. 7, 2002

(65) Prior Publication Data

US 2002/0155363 A1 Oct. 24, 2002

Related U.S. Application Data

(63) Continuation-in-part of application No. 09/669,359, filed on Sep. 26, 2000, now Pat. No. 6,503,666, and a continuation-in-part of application No. 10/085,759, filed on Feb. 28, 2002, now Pat. No. 6,787,271.
(60) Provisional application No. 60/325,689, filed on Sep. 28, 2001, provisional application No. 60/304,142, filed on Jul. 10, 2001, provisional application No. 60/296,788, filed on Jun. 8, 2001, and provisional application No. 60/215,938, filed on Jul. 5, 2000.

(51) Int. Cl.
    *G06F 17/50* (2006.01)

(52) U.S. Cl. .............................. 716/21; 716/19; 716/20
(58) Field of Classification Search .................. 716/21, 716/19, 20; 430/5, 30
See application file for complete search history.

(56) References Cited

U.S. PATENT DOCUMENTS

| 4,037,918 A | * | 7/1977 | Kato ............................. 359/29 |
| 5,302,477 A | | 4/1994 | Dao et al. ....................... 430/5 |
| 5,308,741 A | | 5/1994 | Kemp .......................... 430/312 |
| 5,324,600 A | | 6/1994 | Jinbo et al. ..................... 430/5 |
| 5,364,716 A | | 11/1994 | Nakagawa et al. ............. 430/5 |

(Continued)

FOREIGN PATENT DOCUMENTS

| DE | 195 45 163 A1 | 6/1996 |
| EP | 0 653 679 A2 | 5/1995 |
| GB | 2333613 A | 7/1999 |

(Continued)

OTHER PUBLICATIONS

Yamamoto et al.,"Hierarchical Processing of Levenson-Type Phase Shifter Generation",Dec. 1997, Japanese Journal of Applie Physics, Part 1, No. 12B, vol. 36, pp. 7499–7503.*
Heng et al.,"Application of Automated Design Migration to Alternating Phase Shift Mask (AltPSM) Design", ISPD, Apr. 2001, presentation view graphs (19 pages).*
Cooke, M., "OPC/PSM Designs For Poly Gate Layers", European Semiconductor, vol. 22, No. 7, pp. 57–59, Jul. 2000.

(Continued)

*Primary Examiner*—Vuthe Siek
*Assistant Examiner*—Sun James Lin
(74) *Attorney, Agent, or Firm*—Bever, Hoffman & Harms LLP; Jeannette S. Harms

(57) ABSTRACT

Phase information is incorporated into a cell-based design methodology. Standard cells have four edges: top, bottom, left, and right. The top and bottom edges have fixed phase shifters placed, e.g. 0. A given cell C will have a phase set created with two versions: 0–180 (left-right) as well as 180–0. Alternatively, the same phase set: 0—0 and 180—180 could be created for a cell. The phase sets are selected based on the ability to phase shift the features within the cell C. By creating a phase set for most of the cells of a cell library, standard cell placement and routing techniques can be used and phase can then be quickly assigned using a simple ripple technique. This ensures a phase compliant design upfront for the standard cell areas. In some instances, phase sets are created for every cell in a library

31 Claims, 9 Drawing Sheets

U.S. PATENT DOCUMENTS

| | | | |
|---|---|---|---|
| 5,441,834 A | 8/1995 | Takekuma et al. | |
| 5,472,814 A | 12/1995 | Lin | 430/5 |
| 5,523,186 A | 6/1996 | Lin et al. | 430/5 |
| 5,527,645 A | 6/1996 | Pati et al. | 430/5 |
| 5,537,648 A | 7/1996 | Liebmann et al. | 395/500 |
| 5,538,815 A | 7/1996 | Oi et al. | 430/5 |
| 5,565,286 A | 10/1996 | Lin | 430/5 |
| 5,573,890 A | 11/1996 | Spence | 430/311 |
| 5,595,843 A | 1/1997 | Dao | 430/5 |
| 5,620,816 A | 4/1997 | Dao | 430/5 |
| 5,635,316 A | 6/1997 | Dao | 430/5 |
| 5,636,131 A | 6/1997 | Liebmann et al. | 364/490 |
| 5,686,223 A | 11/1997 | Cleeves | |
| 5,702,848 A | 12/1997 | Spence | 430/5 |
| 5,761,075 A | 6/1998 | Oi et al. | 364/488 |
| 5,766,804 A | 6/1998 | Spence | 430/5 |
| 5,766,806 A | 6/1998 | Spence | 430/5 |
| 5,786,112 A | 7/1998 | Okamoto et al. | |
| 5,807,649 A | 9/1998 | Liebmann et al. | 430/5 |
| 5,858,580 A | 1/1999 | Wang et al. | 430/5 |
| 5,923,562 A | 7/1999 | Liebmann et al. | 364/488 |
| 5,923,566 A | 7/1999 | Galan et al. | 364/489 |
| 5,994,002 A | 11/1999 | Matsuoka | 430/5 |
| 5,998,068 A | 12/1999 | Matsuoka | 430/5 |
| 6,057,063 A | 5/2000 | Liebmann et al. | 430/5 |
| 6,066,180 A | 5/2000 | Kim et al. | 716/19 |
| 6,083,275 A | 7/2000 | Heng et al. | 716/19 |
| 6,130,012 A | 10/2000 | May et al. | 430/5 |
| 6,139,994 A | 10/2000 | Broeke et al. | 430/5 |
| 6,185,727 B1 | 2/2001 | Liebmann | 716/19 |
| 6,228,539 B1 | 5/2001 | Wang et al. | 430/5 |
| 6,238,824 B1 | 5/2001 | Futrell et al. | |
| 6,251,549 B1 | 6/2001 | Levenson | 430/11 |
| 6,258,493 B1 | 7/2001 | Wang et al. | 430/5 |
| 6,303,251 B1 | 10/2001 | Mukai et al. | |
| 6,316,163 B1 | 11/2001 | Magoshi et al. | |
| 6,335,128 B1 | 1/2002 | Cobb et al. | 430/5 |
| 6,338,922 B1 | 1/2002 | Liebmann et al. | 430/5 |
| 6,420,074 B1 | 7/2002 | Wang et al. | 430/5 |
| 6,436,590 B1 | 8/2002 | Wang et al. | 430/5 |
| 6,467,076 B1 | 10/2002 | Cobb | |
| 6,470,489 B1 | 10/2002 | Chang et al. | |
| 6,492,073 B1 | 12/2002 | Lin et al. | |
| 2001/0000240 A1 | 4/2001 | Wang et al. | 430/5 |
| 2001/0028985 A1 | 10/2001 | Wang et al. | 430/5 |
| 2002/0127479 A1 | 9/2002 | Pierrat | 430/5 |
| 2002/0129327 A1 | 9/2002 | Pierrat et al. | 716/19 |
| 2002/0152454 A1 | 10/2002 | Cote et al. | 716/21 |
| 2002/0155363 A1 | 10/2002 | Cote et al. | 430/5 |

FOREIGN PATENT DOCUMENTS

| | | |
|---|---|---|
| JP | 62067547 | 3/1987 |
| JP | 2-140743 | 5/1990 |
| JP | 1283925 | 2/1991 |
| JP | 6-67403 | 3/1994 |
| JP | 8051068 | 2/1996 |
| JP | 8236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 98/12605 A1 | 3/1998 |
| WO | WO 01 23961 A1 | 4/2001 |
| WO | WO 0203140 | 1/2002 |

OTHER PUBLICATIONS

Granik, Y., et al., "Sub–Resolution Process Windows And Yield Estimation Technique Based On Detailed Full–Chip CD Simulation", SPIE, vol. 4182, pp. 335–341 (2000).

Plat, M., et al., "The Impact of Optical Enhancement Techniques on the Mask Error Enhancement Funchtion (MEEF)", SPIE, vol. 4000, pp. 206–214, Mar. 1–3, 2000.

Mansuripur, M., et al., "Projection Photolithography", Optics & Photonics News 11, 17 pages, Feb. 2000.

Ackmann, P., et al., "Phase Shifting and Optical Proximity Corrections to Improve CD Control on Logic Devices in Manufacturing for Sub 0 35 um I Line", SPIF. vol. 3051 pp 146153 Mar. 12 14 1997.

Matsuoka, K., et al., "Application of Alternating Phase–Shifting Mask to 0.16um CMOS Logic Gate Patterns", Matsushita Electric Ind Co., Ltd. (9 pages).

Wang, R., et al., "Plarized Phase Shift Mask: Concept, Design, and Potential Advantages to Photolithography Process and Physical Design", Motorola Semiconductor Product Sector (12 pages).

Ogawa, K., et al., "Phase Defect Inspection by Differential Interference", Lasertec Corporation (12 pages).

Pistor, I., "Rigorous 3D Simulation of Phase Defects in Alternating Phase–Shifting Masks", Panoramic Technology Inc. ( pages).

Semmier, A., et al., "Application of 3D EMF Simulation for Development and Optimization of Alternating Phase Shifting Masks", Infineon Technologies AG (12 pages).

Wong, A., et al., "Polarization Effects in Mask Transmission", University of California Berkeley (8 pages).

Erdmann, A., "Topography Effects and Wave Aberrations in Advanced PSM–Technology", Fraunhofer Institute of Integrated Circuits pages).

Granik, Y., et al., "CD Variation Analysis Technique and its Application to the Study of PSM Mask Misalignment", Mentor, Graphics (9 pages).

Hanyu, et al., "New Phase–Shifting Mask with Highly Transparent SiO2 Phase Shifters", Fujitsu Laboratories Ltd. (11 pages).

Ishiwata, N., et al., "Fabrication of Phase–Shifting Mask", Fujitsu Limited (11 pages).

Levenson, M., et al., "Phase Phirst! An Improved Strong–PSM Paradigm", M.D Levenson Consulting Petersen Advanced Lithography, KLA–Tencor (10 pages).

Levenson, M., et al., "SCAA Mask Exposures and Phase Phirst Design for 110nm and Below", M.D. Levenson Consulting, Canon USA, Inc. JSR Microelectronics, Inc. (10 pages).

Lin, B.J. "The Relative Importance of the Building Blocks for 193nm Optical Lithography", Linnovation, Inc. (12 pages).

McCallum, M., et al., "Alternating PSM Mask Performance a Study of Multiple Fabrication Technqiue Results", International SEMATECH (6 pages).

Morikawa, Y., et al., "100nm–alt.PSM Structure Discussion for ArF Lithography", Dai–Nippon Printing Co., Ltd. (15 pages).

Ozaki, T., et al., "A 0.15um KrF Lithography for 1Gb DRAM Product Using Highly Printable Patterns and Thin Resist Process", Toshiba Corporation (2 pages).

Rhyins, P., et al., "Characterization of Quartz Etched PSM Masks for KrF Lithography at the 100nm Node", Photronics, Inc., MIT Lincoln Lab, ARCH Chemicals, Finle Technologies, KLATencor Corp. (10 pages).

Rosenbluth, A., et al., "Optimum Mask and Source Patterns to Print a Given Shape", IBM (17 pages).

Schmidt, R., et al., "Impact of Coma on CD Control for Multiphase PSM Designs", AMD, ASML (10 pages).

Sewell, H., et al., "An Evaluation of the Dual Exposure Technique", SVG Lithography Systems Inc. (11 pages).

Spence, C. et al., "Optimization of Phase–Shift Mask Designs Including Defocus Effects", AMD. Princeton University, Veco Technologies Inc. (8 pages).

Suzuki, A., et al., "Multilevel Imaging System Realizing k1–Lithography", Canon Inc. (13 pages).

Vandenberghe, G., et al., "(Sub–)100nm Gate Patterning Using 248nm Alternating PSM", IMEC Mentor Graphics (9 pages).

Fritze, M., et al., "100–nm Node Lithography with KrF?", MIT Lincoln Lab, Numberical Technologies, Photronics, Arch Chemicals (14 pages).

Fukuda, H., et al., "Patterning of Random Interconnect Using Double Exposure of Strong–Type PSMs", Hitachi Control Research Lab (8 pages).

Ferguson, R., et al., "Pattern–Dependent Correction of Mask Topography Effects for Alternating Phase–Shifting Masks", IBM Microelectronics, University of California Berkeley (12 pages).

Toublan, O., et al., "Phase and Transmission Errors Aware OPC Solution for PSM: Feasibility Demonstration", Mentor Graphics Corp. (7 pages).

Yamagishima, Y., et al., "Phase–Shifting Photolithography Applicable to Real IC Patterns", Fujitsu Lamited (11 pages).

Levenson, M., et al., "Improving Resolution in Photolithography with a Phase–Shifting Mask", IEEE Transactions On Electron Devices, vol. ED–29, No. 12, pp. 1828–1836, Dec. 1982.

Levenson, M., et al., "The Phase–Shifting Mask II: Imaging Simulation and Submicrometer Resist Exposures", IEEE Transactions on Electron Devices, vol. ED–31, No. 6, pp. 753–763, Jun. 1982.

Tetasawa, T., et al., "0.3–Micron Optical Lithography Using a Phase–Shifting Mask", SPIE, Optical/Laser Microlithography II, vol. 1088, pp. 25–33, Mar. 1989.

Natayama, A., et al., "New Phase Shifting Mask with Self–Aligned Phase Sifters for a Quarter Micron Photolithography", IEDM, pp. 3.3.1–3.3.4, Dec. 3–6, 1989.

Jimbo, H., et al., "0.2um or Less i–Line Lithography by Phase–Shifting–Mask Technology", IEEE, pp. 33.3.1–33.3.4 (1990).

Neureuther, A., "Modeling Phase Shifting Masks", SPIE, 10th Annual Symposium On Microlithography, vol. 1496, pp. 80–85 (1990).

Yamanaka, T., et al., "A 5.9um2 Super Low Power SRAM Cell Using a New Phase–Shift Lithography", IEDM, pp. 18.3.1–18.3.4 (1990).

Inokuchi, K., et al., "Sub–Quarter Micron Gate Fabrication Process Using Phase–Shifting–Mask for Microwave GaAs Devices", Extended Abstracts Of The 1991 Intl. Conference On Solid State Devices And Materials, Yokohama, Japan, pp. 92–94 (1991).

Inokuchi, K., et al., "Sub–Quarter–Micron Gate Fabrication Process Using Phase–Shifting Mask for Microwave GaAs Devices", Japanese Journal Of Applied Physics, vol. 30, No. 12B, pp. 3818–3821, Dec. 1991.

Jimbo, H., et al., "Improvement of Phase–Shifter Edge Line Mask Method", Japanese Journal Of Applied Physics, vol. 30, No. 11B, pp. 2998–3003, Nov. 1991.

Kimura, T., et al., "Subhalf–Micron Gate GaAs Mesfet Process Using Phase–Shifting–Mask Technology", IEEE, GaAs IC Symposium, pp. 281–284 (1991).

Wiley, J., et al., "Phase Shift Mask Pattern Accuracy Requirements and Inspection Technology", SPIE, Integrated Circuit Metrology, Inspection, And Process Control V, vol. 1464, pp. 346–355 (1991).

Hirai, Y., et al., "Automatic Pattern Generation System for Phase Shfiting Mask", 1991 Symposium on VLSI Technology, Digest of Technical papers, pp. 95–96, May 28–30, 1991.

Wong, A., et al., "Investigating Phase–Shifting Mask Layout Issues Using a Cad Toolkit", IEEE, pp. 27.4.1–27.4.4 (1991).

Terasawa, T., et al., "Imaging Characteristics of Multi–Phase–Shifting and Halftone Phase–Shifting Masks", Japanese Journal of Applied Physics, vol. 30, No. 11B, pp. 2991–2997, Nov. 1991.

Burggraaf, P., "Four More Significant Japanese Advances in Phase Shfiting Technology", Semiconductor International, p 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual BACUS Symposium on Photmask Technology, vol. 1604, pp. 226–235, Sep. 25–27, 1991.

Nolscher, C., et al., "Investigation of Self–Aligned Phase–Shifting Reticles by Simulation Techniques", SPIE—Optical Laser Microlithography IV, vol. 1463, pp. 135–150 (1991).

Inoue, S., et al., "Simulation Study on Phase–Shifting Masks for Isolated Patterns", Japanese Journal of Applied Physics, vol. 30, No. 11B, pp. 3010–3015, Nov. 1991.

Watanabe, H., et al., "Detection and Printability of Shifter Defects in Phase–Shifting Masks", Japanese Journal of Applied Physics, vol. 30, No. 11B, pp. 3016–3020, Nov. 1991.

Watanabe, H., et al., "Pattern Transfer Characteristics of Transparent Phase Shifting Mask", Japanese Journal of Applied Physics, vol. 30, No. 11B, pp. 3004–3009, Nov. 1991.

Jinbo, H., et al., "Application of Blind Method to Phase–Shifting Lithography", IEEE, 1992 Sympsoium ON VLSI Technology Digest Of Technical Papers, pp. 112–113 (1992).

Watanabe, H., et al., "Detection and Printability of Shifter Defects in Phase–Shifting Masks II Defocus Characteristics", Jpn. J. Appl. Phys., vol. 31, pp. 4155–4160 (1992).

Pierrat, C., et al., "Phase–Shifting Mask–Topography Effects on Lithographic Image Quality", IEEE, pp. 3.3.1–3.3.4 (1992).

Barggraaf, P., "Lithography's Leading Edge, Part 1: Phase–Shift Technology and Part 2: I–Line and Beyond", Semiconductor International, pp. 43–47 and 52–56, Feb. 1992.

IBM, "Phase–Shift Mask Utilizing Silicon Oxy–Nitride as a Low Reflectivity Phase–Shift Layer", IBM Technical Disclosure Bulletin, vol. 34, No. 10B, pp. 360–361, Mar. 1992.

Brunner, T., et al., "170nm Gates Fabricated by Phase–Shift Mask and Top Anti–Reflector Process", SPIE, Optical Laser Microlithography VI, Vo. 1927, pp. 182–189 (1993).

Lin, B.J., "Phase–Shifting Masks Gain an Edge", IEEE Circuits & Devices, pp. 28–35, Mar. 1993.

Moniwa, A., et al., "Algorithm for Phase–Shift Mask Design with Priority on Shifter Placement", Jpn. J. Appl. Phys., vol. 32, Pt. 1, No. 12B, pp. 5874–5879, Dec. 1193.

Ooi, K., et al., "Computer Aided Design Software for Designing Phase–Shifting Masks", Jpn. J. App., Phys., vol. 32, Pt. 1, No. 12B, pp. 5887–5891, Dec. 1993.

Ohtsuka, H., et al., "Evaluation of Repair Phase and Size Tolerance for a Phase–Shift Mask", J. Vac. Sci. Technol. B, vol. 17, No. 6, pp. 2665–2668, Nov./Dec. 1993.

Ronse, K., et al., "Comparison of Various Phase Shift Strategies and Application to 0.35um ASIC Designs", SPIE—Optical Laser Microlithography VI, vol. 1927, pp. 2 16 (1993).

Galan, G., et al., "Application of Alternating–Type Phase Shift Mask to Polysilicon Level for Random Logic Circuits", Jpn. J. Appl. Phys., vol. 33, pp. 6779–6784 (1994).

Mizuno, F., et al., "Practical Phase–Shifting Mask Technology for 0.3um Large Scale Integrations", J. Vac. Sci. Technol. B, vol. 12, No. 6, pp. 3799–3803, Nov./Dec. 1994.

Pati, Y.C., et al., "Phase–Shifting Masks for Microlithography, Automated Design and Mask Requirements", J. Opt. Soc. Am.: vol. 11, No. 9, pp. 2438–2452, Sep. 1994.

Stirniman, J., et al., "Wafer Proximity Correction and Its Impact on Mask Making", Bacus News, vol. 10, Issue 1, pp. 1.3–2. 10–12, Jan. 1994.

Waas, T., et al., "Automatic Generation of Phase Shift Mask Layouts", Microelectronic Engineering, vol. 23, pp. 139–142 (1994).

Barouch, E., et al., "OPTIMASK: An OPC Algorithm for Chrome and Phase–Shift Mask Design", SPIE Vo. 2440, pp. 192–206, Feb. 1995.

Moniwa, A., et al., "Heuristic Method for Phase–Conflict Minimization in Automatic Phase–Shift Mask Design", Jpn. J. Appl. Phys. vol. 34, Pt. 4, No. 12B, pp. 6584–6589, Dec. 1995.

Langston, J. et al., "Extending Optical Lithography to 0.25um and Below", Solid State Technology, pp. 57–64, Mar. 1995.

Nagahiro, Y., "Improved Mask Technique for Photolithography Applied to 0.25nm LSI—Improvement of Resolution, Pattern Correction, Exposure Area", Nikkei Microdevices, pp. 1 6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Optical Characteristics of Materials for Phase–Shifting Masks", Applied Optics, vol. 34, No. 22, pp. 4923–4928, Aug. 1, 1995.

Galan, G., et al., "Alternating Phase Shift Generation for Coplex Circuit Designs", SPIE, vol. 2884, pp. 508–519, Sep. 18–20, 1996.

Kanai H., et al., "Sub–Quarter Micron Lithography with the Dual–Trench Type Alternating PSM", SPIE, vol. 2793, pp. 165–173 (1996).

Ishiwata, N., et al., "Novel Alternating Phase Shift Mask with Improved Phase Accuracy", SPIE, Proceedings Of the 17th Annual Symposium On Photomask Technology And Management, vol. 3236, pp. 243 249 (1997).

Morimoto, H., et al., "Next Generation Mask Strategy—Technologies are Ready for Mass Production of 256MDRAM?", SPIE, vol. 3236, pp. 188–189 (1997).

Raman, B., et al., "Implications of Device Processing on Photomask CD Requirements", SPIE, vol. 3236, (1997) (Abstract Only).

Nakae, A., et al., "A Proposal for Pattern Layout Rule in Application of Alternating Phase Shift Mask", SPIE, vol. 3096, pp. 262–374 (1997).

Tsujimoto, E., et al., "Hierarchical Mask Data Design Systems (PROPHET) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys. vol. 36, Part 1, No. 12B, pp 7499–7503, Dec. 1997.

Gordon, R., et al., "Design and Analysis of Manufacturable Alternating Phase–Shifting Masks", Bacus News, vol. 14, Issue 12, pp. 1–9, Dec. 1998.

Nara, M., et al., "Phase Controllability Improvement for Alternating Phase Shift Mask", Dai Nippon Printing Co. Ltd. (16 pages).

Ohnuma, H., et al., "Lithography Computer Aided Design Technology for Embedded Memory in Logic", Jpn. J. appl. Phys., vol. 37, Part 1, No. 12B, pp. 6686–6688, Dec. 1998.

Fukuda, H., "Node–Connection Quantum Phase–Shifting Mask Path to Below 0.3um Patch, Proximity Effect Free, Random Interconnects and Memory Patterning", J. Vac. Sci. Technol. B, vol. 17, No. 6, pp. 3294–3295, Nov./Dec. 1999.

Spence, C., et al., "Integration of Optical Proximity Correction Strategies in Strong Phase Shifters Design for Poly–Gate Layers", Bacus News, vol. 15, Issue 12, pp. 1, 4–13, Dec. 1999.

Kuo, C., et al., "Extension of Deep–Ultraviolet Lithography for Patterning Logic Gates Using Alternating Phase Shifting Masks", J. Vac. Sci. Technol. B, vol. 17, No. 6, pp. 3296–3300, Nov./Dec. 1999.

Palmer, S., et al., "Dual Mask Model–Based Proximity Correction for High Performance 0.10um CMOS Process", The 44th International Conference on Electron, Ion and Photon Beam Technology and Nanofabrication Abstracts, pp. 18–19, May 30–Jun.

Kikuchi, K., et al., "Method of Expanding Process Window for the Double Exposure Technique with alt–PSMs", Optical Microlithography XIII, Proceeding of SPIE, vol. 4000, pp. 121–131 (2000).

* cited by examiner

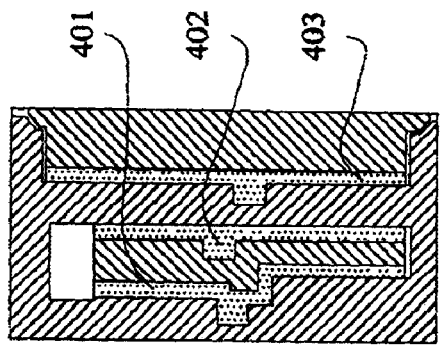
Figure 4A
Figure 4B
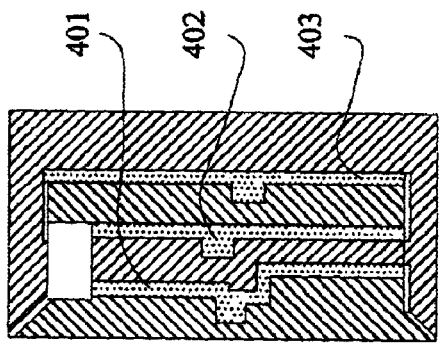
Figure 4C
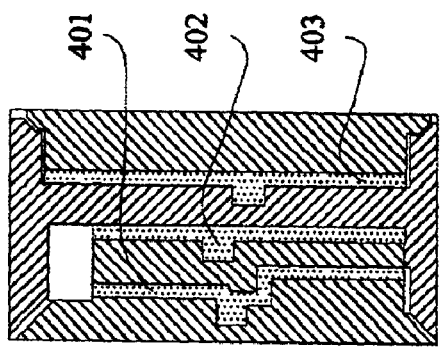
Figure 4D

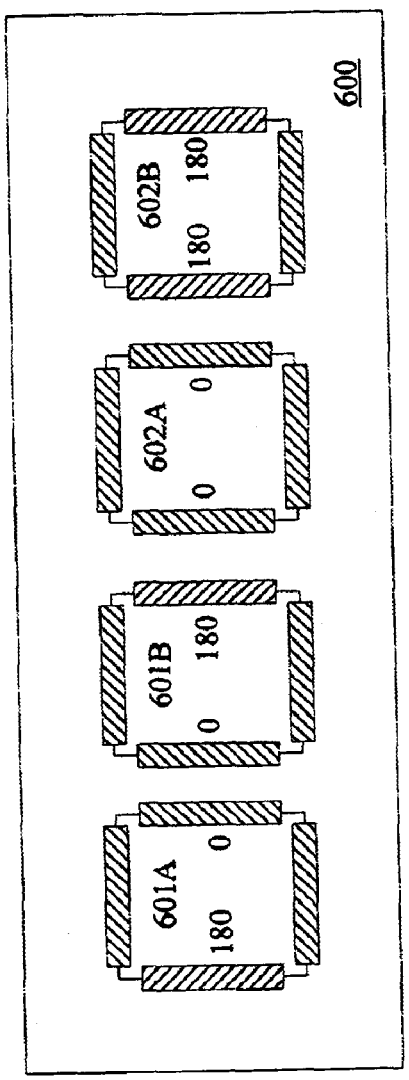
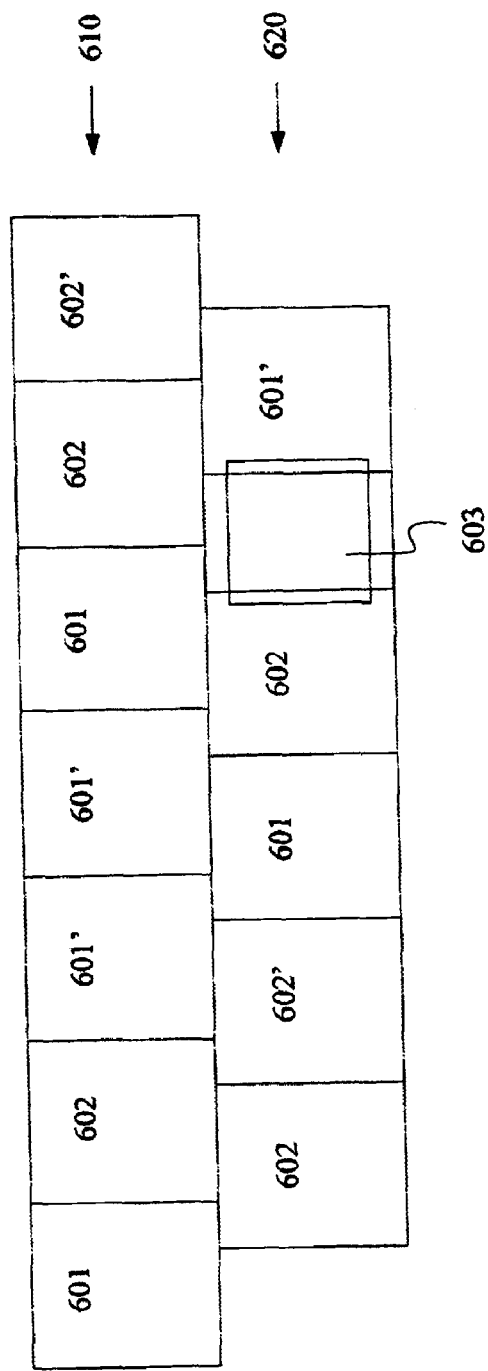

STANDARD CELL DESIGN INCORPORATING PHASE INFORMATION

RELATED APPLICATIONS

The present application is a non-provisional or a continuation-in-part of the following:

This application is related to, claims the benefit of priority of, and incorporates by reference, the U.S. Provisional Patent Application Ser. No. 60/296,788, filed Jun. 8, 2001, entitled "Phase Conflict Resolution for Photolithographic Masks", having inventors Christophe Pierrat and Michel Côté, and assigned to the assignee of the present invention.

This application is related to, claims the benefit of priority of, and incorporates by reference, the U.S. Provisional Patent Application Ser. No. 60/304,142, filed Jul. 10, 2001, entitled "Phase Conflict Resolution for Photolithographic Masks", having inventors Christophe Pierrat and Michel Côté, and assigned to the assignee of the present invention.

This application is related to, claims the benefit of priority of, and incorporates by reference, the U.S. Provisional Patent Application Ser. No. 60/325,689, filed Sep. 28, 2001, entitled "Cost Functions And Gate CD Reduction In Phase Shifting Photolithographic Masks", having inventors Christophe Pierrat and Michel Côté, and assigned to the assignee of the present invention.

This application is related to, claims the benefit of priority of an incorporates by reference, continuation-in-part of U.S. patent application Ser. No. 09/669,359 filed Sep. 26, 2000, now U.S. Pat. No. 6,503,666, issued Jan. 7, 2003, entitled "Phase Shift Masking for Complex Patterns", having inventor Christophe Pierrat, and assigned to the assignee of the present invention, which is related to U.S. Provisional Patent Application Ser. No. 60/215,938, filed Jul. 5, 2000, entitled "Phase Shift Masking For Complex Layouts", having inventor Christophe Pierrat, and assigned to the assignee of the present invention.

This application is related to, claims the benefit of priority of, and incorporates by reference, continuation-in-part of the U.S. patent application Ser. No. 10/085,759, filed Feb. 28, 2002, now U.S. Pat. No. 6,787,271, issued Sep. 7, 2004, entitled "Design And Layout Of Phase Shifting Photolithographic Masks", having inventors Michel Luc Côté and Christophe Pierrat, and assigned to the assignee of the present invention.

BACKGROUND OF THE INVENTION

1. Field of the Invention

The present invention relates to standard cell design and, in particular, to standard cells that can include phase information.

2. Discussion of the Related Art

Lithography is a well-known process used in the semiconductor industry to form lines, contacts, and other known structures in integrated circuits (ICs). In conventional lithography, a mask (wherein the term "mask" as used herein can refer to a mask or a reticle) having a pattern of transparent and opaque regions representing such structures in one IC layer is illuminated. The emanating light from the mask is then focused onto a photoresist layer provided on a wafer. During a subsequent development process, portions of the photoresist layer are removed, wherein the portions are defined by the pattern. In this manner, the pattern of the mask is transferred to (i.e. printed on) the photoresist layer.

However, diffraction effects at the transition of the transparent regions to the opaque regions on the mask can render the corresponding printed edges on the wafer indistinct, thereby adversely affecting the resolution of the lithography process. Various techniques have been proposed to improve the resolution. One such technique, phase shifting, uses phase destructive interference of the waves of incident light. Specifically, phase shifting shifts the phase of a first region of incident light waves approximately 180 degrees relative to a second, adjacent region of incident light waves to create a sub-wavelength feature between the first and second regions. Thus, a feature, as defined by exposed and unexposed portions of a photoresist illuminated through a mask, can be more closely defined by using phase shifting, thereby allowing greater structure density on the IC.

As the need for feature density increases, phase shifting is being applied to more features on the layout. In one embodiment, called a full phase approach, substantially all features of a layer can be defined using phase shifting. To maximize their effect, the phase shifting regions, hereinafter called shifters, can be made as large as possible in light of limitations presented by the input layout.

Typically, basic structures are used hundreds or even thousands of times on the same IC. Therefore, designers commonly use a standard cell library, wherein each cell includes one or more unique structures of varying complexity. Exemplary structures can include, for example, gates, latches, and flip-flops. These cells can then be used to build structures of greater complexity, such as memory, adders, and multipliers.

Because the physical layout for each cell is developed, using a standard cell library can result in a significantly reduced design turnaround time compared to "re-designing" a structure for each version in the layout. However, to take advantage of phase shifting in a typical standard cell methodology, shifters are inserted into the layout after place-and-route or even after design sign-off. Unfortunately, the time spent between sign-off and fabricating an IC can be the most critical part of a design schedule. Therefore, the time spent inserting shifters at this late stage can result in highly undesirable delays.

Moreover, inserting shifters in standard cell layouts can result in phase conflicts. Phase conflicts can negate the optical interference necessary to create the desired feature (s). Therefore, assigning phase to and resolving phase conflicts in the layout can constitute a time-intensive, but mandatory part of typical process flows in the production of many integrated circuits.

For these reasons, a need arises for a system and method of incorporating phase information into a standard cell methodology. This incorporation should provide a more time-efficient process as well as minimize phase conflict.

SUMMARY OF THE INVENTION

In accordance with one feature of the invention, phase information can be incorporated into any cell-based design methodology. For example, a standard cell can include at least two cell versions. Each cell version includes four edges with associated shifters. Two opposite edges, e.g. the top and bottom edges, can have shifters of a predetermined phase. In one embodiment, the predetermined phase can be the phase easiest to manufacture. Using current technology, the predetermined phase can be 0 degrees, which requires no etching. The other two opposite edges, e.g. the left and right edges, of the cell version can have shifters of opposite phases or of the same phase. Thus, the left and right edges can have shifters of 0/180, 180/0, 0/0, or 180/180 degrees.

In one embodiment, the cell versions can be manipulated to provide mirrored cell images. This manipulation can include flipping the contents of the cell version on a vertical axis. In this manner, assuming that the cell version has left/right shifters of 180/0 degrees, then the mirrored cell image has left/right shifters of 0/180 degrees. Note that any features and phase shifting regions within the cell version are also flipped on the vertical axis.

A standard cell library including standard cells with phase information can also be provided. The phase information can include at least first and second phase sets, wherein each phase set includes two cell versions. In the first phase set, the cell versions have opposite edges with shifters of the same phase (e.g. 0/0 and 180/180 degrees). In the second phase set, the cell versions have opposite edges with shifters of opposite phases (e.g. 0/180 and 180/0 degrees). In one embodiment, the standard cell library can include filler cells, wherein a filler cell can have a predetermined phase or predetermined phases to match the phase of abutting shifters in adjacent cell versions. For example, in one standard cell library, filler cells having left/right edges with shifters having phases of 0/0, 0/180, 180/0, and 180/180 can be provided. In another standard cell library, filler cells having either a first phase set of 0/0 and 180/180 or a second phase set of 0/180 and 180/0 can be provided.

A method of designing an integrated circuit (IC) is also provided. The method can include receiving a pattern associated with the IC. The library of standard cells including phase information can then be accessed. The appropriate standard cells from the library can be identified to build the pattern. The identified standard cells (or mirrored images of the standard cells) or filler cells can be placed in rows to implement the pattern. At this point, the appropriate cell version for each standard cell, if available, can be selected.

In one embodiment, a cell version for a standard cell at an end of a row can be selected. At this point, phase assignments can be propagated along the row based on previously selected cell versions. For example, assume that a cell version having left/right shifters of 0/180 degrees is selected to implement a standard cell at the left end of a row. An appropriate cell version to implement the abutting standard cell would have a left shifter of 180 degrees. Because each standard cell has an associated phase set, the cell version from the phase set having the appropriate phase assignment (i.e. 180/0 or 180/180 degree phase shifters) can be selected to implement the adjacent standard cell. This phase analysis can be propagated down a row for each standard cell having associated phase information. Other rows can be built with cell versions in a similar manner. The rows of the cell versions provide a phase-shifted pattern for the integrated circuit.

Of importance, this incorporation of phase information into the standard cell methodology provides an error-free place-and-route flow with minimal impact on cell layout. Note that the phase assignment propagation can be done at any time after placement of the standard cells. Therefore, unlike prior art methodologies, phase assignment can be performed in a time efficient manner.

To ensure this error-free place-and-route flow, the shifters associated with the edges of the standard cell can be strategically placed. For example, a measurement between an end of a top/bottom shifter and a vertical edge is either greater than ½ separation or 0 separation (wherein the term "separation" refers to a minimum distance required between two shifters on a photolithographic mask used to fabricate the integrated circuit). This measurement controls the spacing between shifters on horizontal edges of the standard cells. In one embodiment, a standard cell library includes cell versions with ½ separation, thereby providing full separation between top/bottom shifters of adjacent cells in the row. In another embodiment, the standard cell library includes cell version with 0 separation, thereby providing no separation between top/bottom shifters of adjacent cells in the row.

A measurement between an end of a left/right shifter and a horizontal edge is a sum of ½ dimension and 1 separation (wherein the term "dimension" refers to a minimum dimension required for any shifter). This measurement controls the spacing between a left/right shifter and a bottom/top shifter in a standard cell. In other words, this measurement ensures that left/right and bottom/top shifters in a standard cell do not touch, thereby preventing any potential DRC violation. Other measurements, including measurements controlling the amount a shifter can extend beyond an edge and/or the amount a shifter can extend into the cell, can also be provided.

Some embodiments of the invention can include a computer program for defining a photolithographic mask that transfers a target pattern to an integrated circuit. The computer program can include source code segments for performing the above-described processes. Other embodiments of the invention can include a system for designing a phase shifting mask (PSM) that transfers a pattern onto an integrated circuit. The system can at least include the means for accessing the library of standard cells including phase information. Other elements of the system could include the means for identifying and placing standard cells to implement the pattern as well as the means for propagating phase assignments along the row based on previously selected cell versions.

BRIEF DESCRIPTION OF THE FIGURES

The file of this patent contains at least one drawing executed in color. Copies of this patent with color drawing (s) will be provided by the Patent and Trademark Office upon request and payment of the necessary fee.

FIGS. 4A–4D illustrate three exemplary features within a standard cell with four full phase assignments. In this case, the full phase assignments of FIGS. 4A and 4D result in phase conflicts and therefore are invalid assignments, whereas the full phase assignments of FIGS. 4B and 4C result in no phase conflicts and therefore are valid assignments.

FIG. 6A illustrates a library including multiple generic cells, each generic cell having a valid phase set.

FIG. 6B illustrates two exemplary rows of standard cells, each row built with generic standard cells without specific reference to phase assignment.

DETAILED DESCRIPTION OF THE FIGURES

In accordance with one feature of the invention, phase information can be incorporated into standard cells. In this manner, a valid phase solution can be assured when a design is built using standard cells. The incorporated phase information can also advantageously maintain place-and-route requirements for cell abutment, thereby simplifying design implementation.

Figure 1:
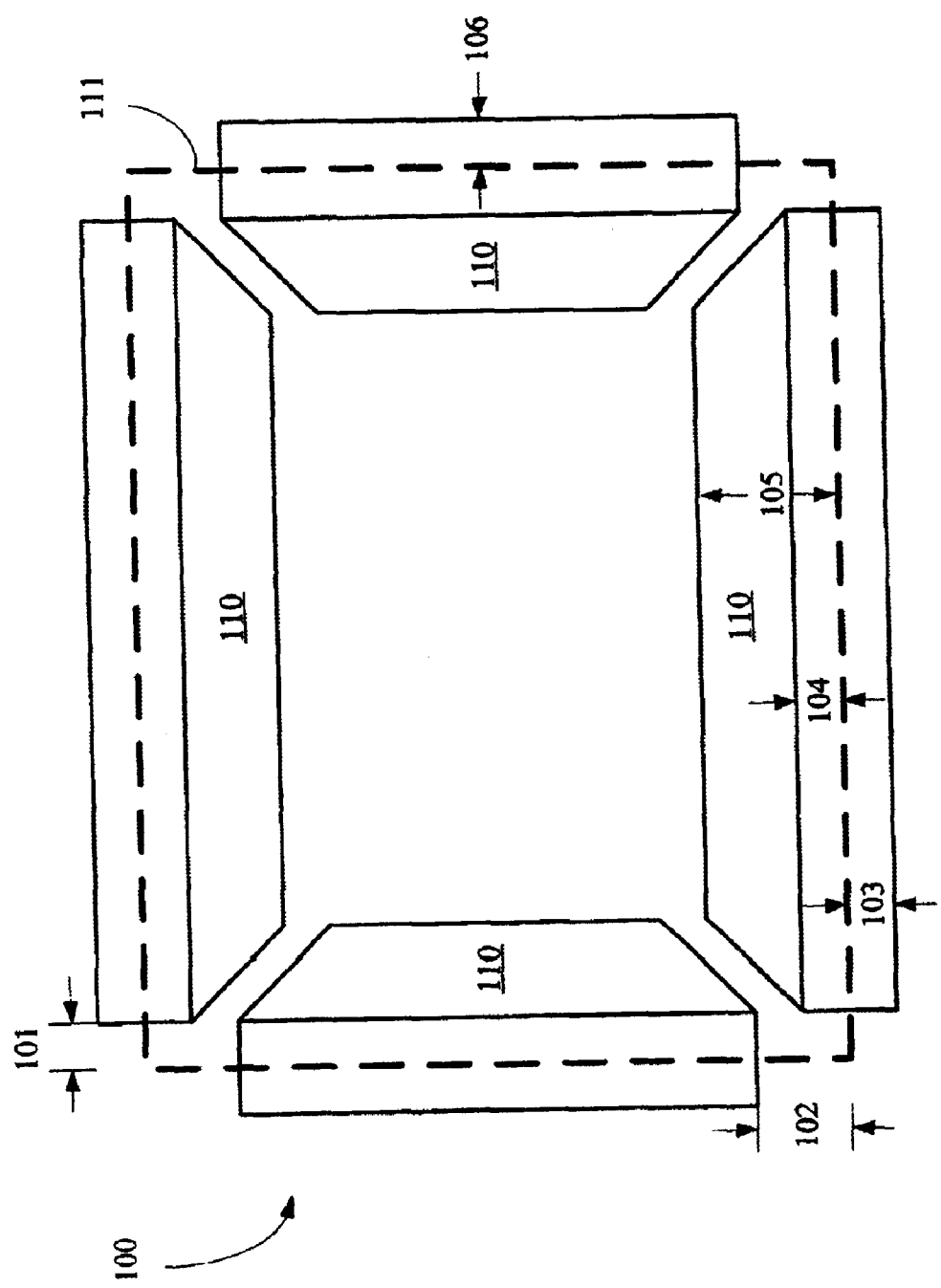
FIG. 1 illustrates a simplified standard cell including shifters provided on the edges of the cell.

FIG. 1 illustrates a simplified standard cell (also called a cell herein) 100 including four shifters 110, wherein each shifter 110 is associated with an edge 111 of cell 100. Note that the actual shape and size of shifters 110 can vary depending on the feature(s) (not shown) included in cell 100. U.S. patent application Ser. No. 10/085,759, entitled "Design and Layout of Phase Shifting Photolithographic Masks", filed on Feb. 28, 2002 by Numerical Technologies, Inc., and incorporated by reference herein, describes the placement, sizing, and shape of shifters in a full phase cell. In FIG. 1, cuts, or openings, are located between shifters 110 to ensure design rule checking (DRC) correct results if two adjacent shifters have opposite phases and to decouple the vertical and horizontal axes for phase assignment. The term "separation", as used herein, refers to the minimum distance required between two shifters on a mask. The term "dimension", as used herein, refers to the minimum dimension required for any shifter.

Further note that shifters 110 are shown as extending outside edge 111. This extension allows various measurements regarding abutting cells to be more fully described and does not necessarily reflect the physical layout of the shifters. In other words, in one embodiment of an actual cell, shifters 110 could extend to, but not extend past edge 111. Alternatively, shifters 110 could extend past edge 111, but could then be merged on the layout with their respective adjacent shifters.

Figure 2B:
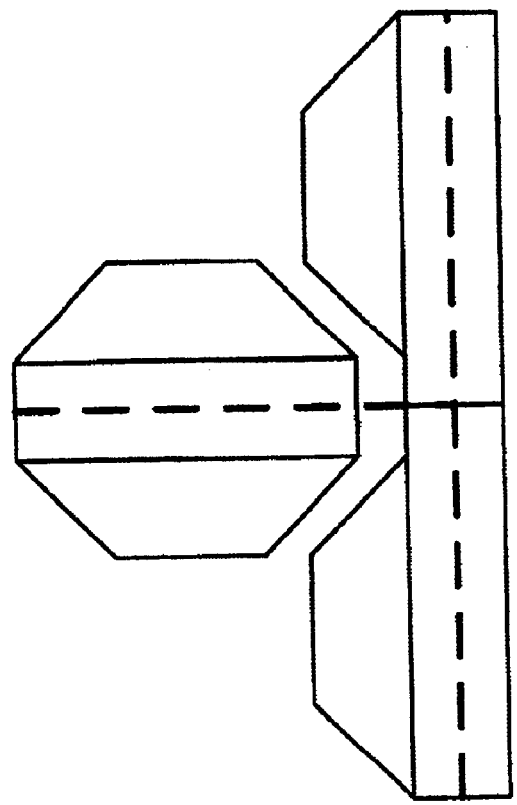
FIG. 2B illustrates two adjacent cell corners, wherein each cell conforms to a zero spacing rule.
Figure 2A:
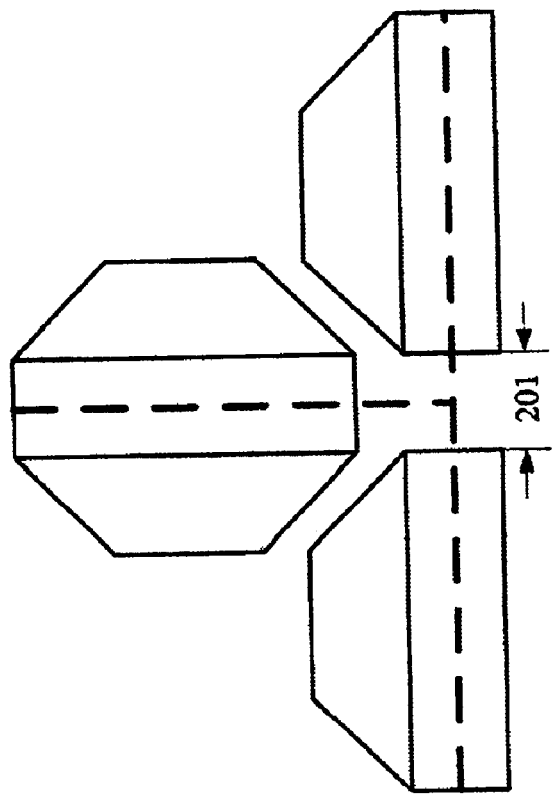
FIG. 2A illustrates two adjacent cell corners, wherein each cell conforms to a ½ spacing rule.

The basic structure of cell 100 includes a measurement 101, which controls the horizontal spacing between shifters in adjacent cells. Measurement 101 can be greater than ½ separation, thereby ensuring full separation between two adjacent shifters in a row. For example, FIG. 2A illustrates a portion of two adjacent shifters in a row, wherein the shifters on the bottom edge have a full separation 201.

Alternatively, measurement 101 can be zero, thereby providing no spacing between adjacent shifters in a row. For example, FIG. 2B illustrates a portion of two adjacent shifters in a row, wherein the shifters on the bottom edge are not separated. In one embodiment, a library of cells either includes cells with measurement 101 of greater than ½ separation or cells with measurement 101 of no spacing.

Referring back to FIG. 1, a measurement 102 controls the vertical spacing between shifters in adjacent cells. Measurement 102 can be the sum of ½ dimension and a full separation. In this manner, assuming that a cut is present at the corner, measurement 102 ensures that a left/right shifter does not touch a top/bottom shifter (which could otherwise cause a DRC violation).

Measurement 103 indicates a maximum extension of shifters in a vertical direction, i.e. extending from the top and bottom edges of cell 100, beyond edge 111 of ½ dimension. This maximum extension can be used to ensure that at most a full dimension is provided if cells abut cell 100 in the vertical direction. Note that measurement 103 is limited by measurement 102, i.e. if measurement 103 were larger than ½ dimension, then a DRC violation could occur with measurement 102. Measurement 106 indicates an extension of shifters in a horizontal direction, i.e. extending from the right and left sides of cell 100, beyond edge 111 of at least ½ dimension. This minimum extension can be used to ensure that at least a full dimension is provided if cells abut cell 100 in the horizontal direction. In one embodiment, measurement 106 can be less than ½ polysilicon separation. In other words, if a polysilicon feature in the cell can be within ½ separation from a left/right edge, then a shifter in an abutting cell cannot extend into the current cell by more than this amount. Otherwise, the neighboring shifter would overlap with the polysilicon feature and make it thinner. Note that measurements 103 and 106 can advantageously prevent DRC errors when the abutted cells are placed one routing grid apart. (A router commonly uses a grid to facilitate placing wires, contacts, and other structures. Therefore, in one embodiment, a standard cell can be designed to be an integer number of routing grids wide and tall, thereby facilitating access to the pins of the cell. In this manner, structures on the grid can be substantially aligned, thereby allowing predictability in the alignment between any two cells, i.e. an integer number of grids apart.) Measurement 104 indicates a minimum width of a rectangular portion of the shifter (which abuts an interior edge of the cell) of ½ dimension, thereby facilitating the sharing of top/bottom edges of abutting cells. Note that a zero dimension could also be acceptable, but the shifter must still meet the minimum dimension if no cells abut cell 100. Finally, measurement 105 can indicate a maximum recommended amount by which any shifter 110 can extend into cell 100 to better resolve a critical feature from an adjacent cell.

In accordance with one feature of the invention, phase assignment (also called coloring) options for these shifters can be included in each standard cell. To facilitate the abutment of multiple cells as well as rows of cells, the top and bottom shifters of the cells can be set to the same predetermined phase. In one embodiment, the predetermined phase can be the phase easiest to manufacture. For example, in current technology, the easiest phase to manufacture is 0 degrees (which does not require etching). For purposes of describing FIGS. 3A–3D and 6A–6B, a predetermined phase of 0 degrees will be assumed for the top and bottom shifters of the cells. However, note that 180 degrees could also be used in other embodiments. Additionally, note that while the standard cell is described herein with respect to 0 and 180 degree shifters, a more general description could refer to θ and θ+180 degree shifters.

In accordance with another feature of the invention, after the predetermined phase is set for the top and bottom shifters, certain phase sets of right/left shifters are selected for individual cells. Theoretically, four phase assignments can be made to the right/left shifters, i.e. 0/180, 180/0, 0/0, and 180/180. However, to reduce library size, two phase assignment options (called a phase set) for each cell can suffice for placement and routing purposes. Specifically, in one embodiment, to facilitate placement of adjacent cells in a row, the right shifters in the phase set should have both 0 and 180 degrees. Similarly, the left shifters in the phase set should also have both 0 and 180 degrees.

Figures 3A, 3B:
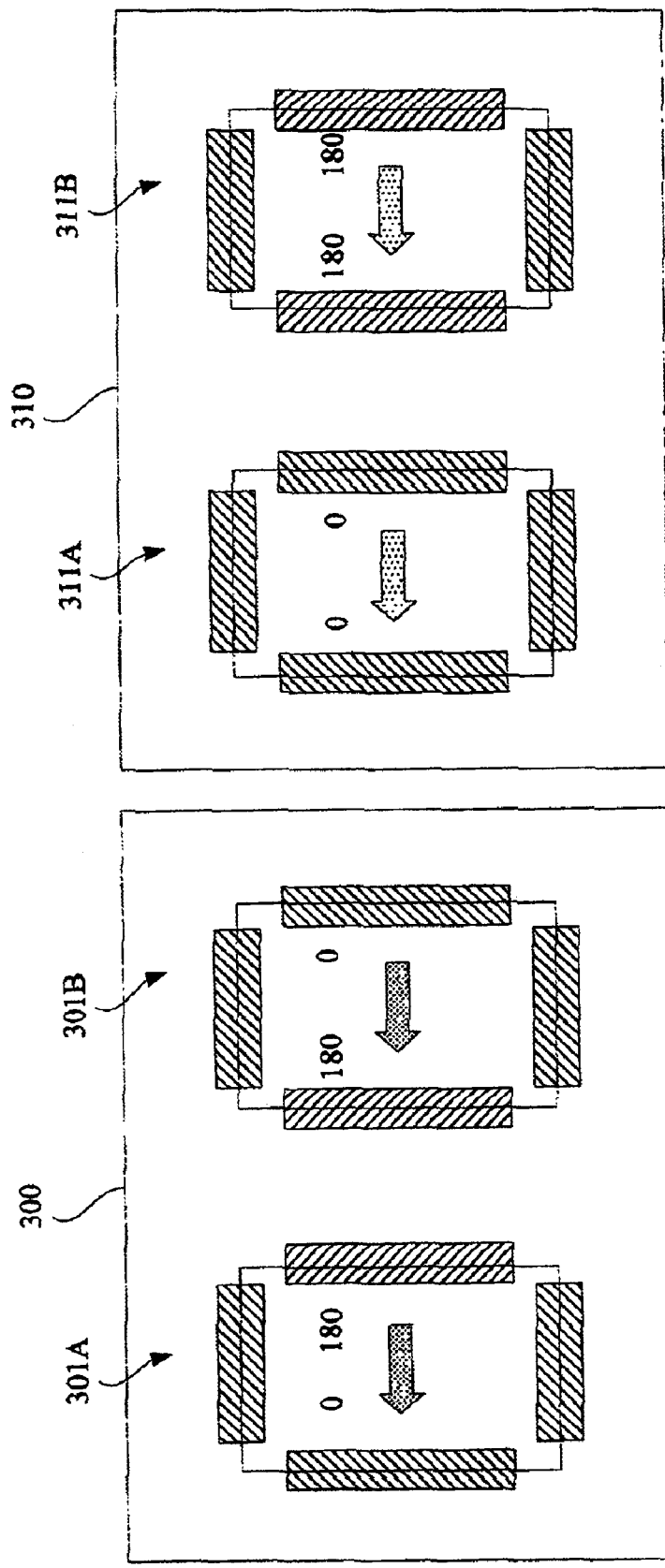
FIG. 3A illustrates a first standard cell phase set, wherein each cell version in the phase set includes shifters of the same phase on the top and bottom edges and shifters of opposite phase on the right and left edges.
FIG. 3B illustrates a second standard cell phase set, wherein each cell version in the phase set includes shifters of the same phase on the top and bottom edges and shifters of the same phase on the right and left edges.

For example, FIG. 3A illustrates a phase set 300 including a cell version 301A for a single cell 301 (not shown individually) having 0 degrees and 180 degrees respectively assigned to left and right shifters. Phase set 300 further includes a cell version 301B having 180 degrees and 0 degrees respectively assigned to left and right shifters. Because of the opposite phase assignments for the left and right shifters in each of cell versions 301A and 301B, phase set 300 is also called an opposite phase set. Note that cell versions 301A and 301B include the same feature(s) therein for cell 301 (not shown individually), as indicated by the large arrow with dense dot fill pattern.

In contrast, FIG. 3B illustrates another phase set 310 including a cell version 311A for a single cell 311 (not shown individually) having 0 degrees assigned to both left and right shifters. Phase set 310 further includes a cell version 311B having 180 degrees assigned to both left and right shifters. Because the phase assignments for the left and right shifters in each cell version 311A and 311B are the same, phase set 310 is also called a same phase set. Note that cell versions 311A and 311B include the same feature(s) therein for cell 311 (not shown individually), as indicated by the large arrow with sparse dot fill pattern.

Of importance, the cell versions of both phase sets 300 and 310 meet the requirement that both right and left shifters are assigned both 0 and 180 degrees. For example, the right shifters of cell versions 301A and 301B are assigned both 0 and 180 degrees (similarly, the left shifters of cell versions 301A and 301B are also assigned both 0 and 180 degrees). The right shifters of cell versions 311A and 311B are also assigned both 0 and 180 degrees (similarly, the left shifters of cell versions 311A and 311B are also assigned both 0 and 180 degrees).

Figure 3D:
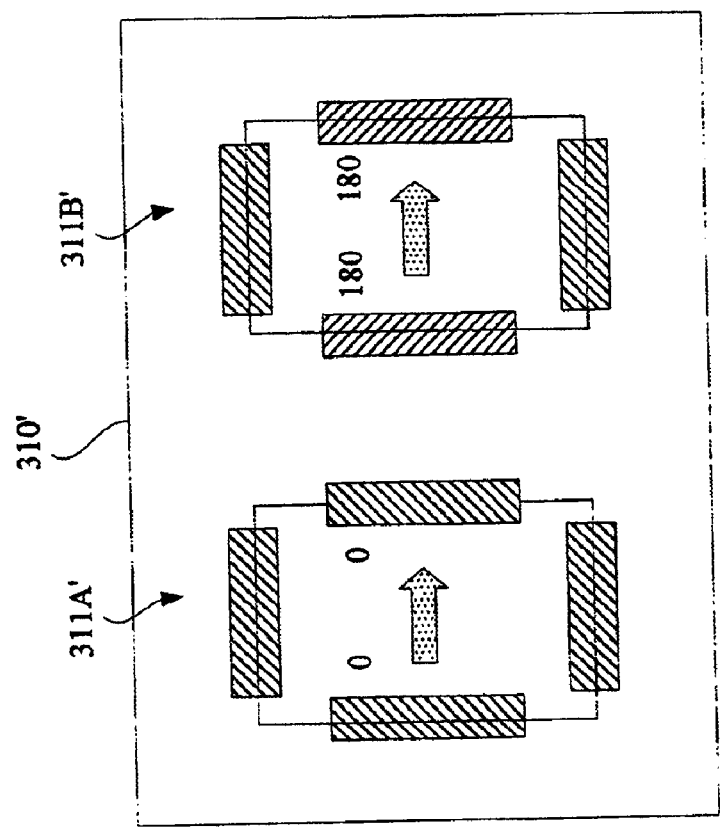
FIG. 3D illustrates the mirrored images of the cell versions (i.e. the second standard cell phase set) shown in FIG. 3B.
Figure 3C:
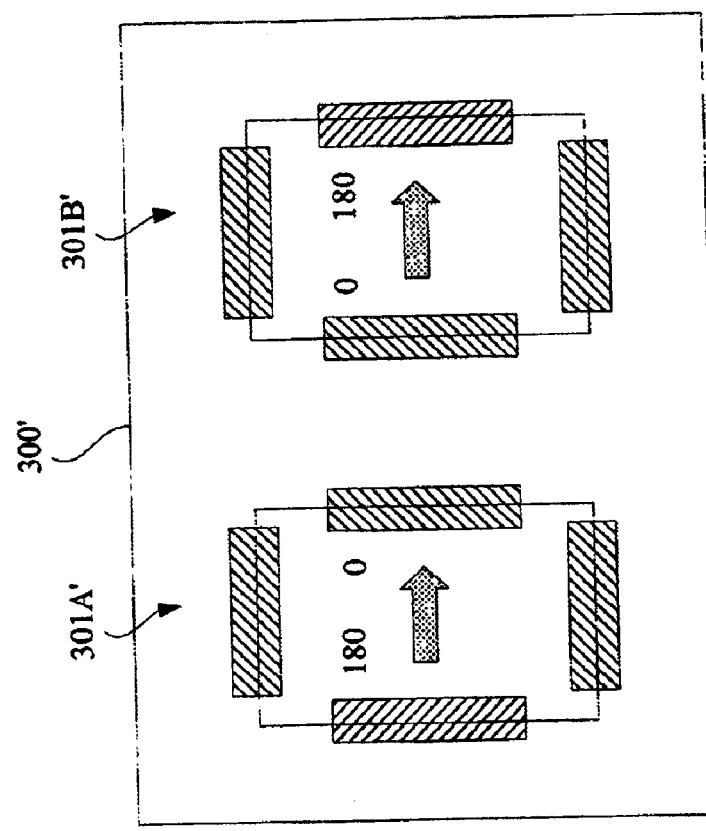
FIG. 3C illustrates the mirrored images of the cell versions (i.e. the first standard cell phase set) shown in FIG. 3A.

Note phase sets 300 and 310 can be easily manipulated to provide mirror images of each cell version. For example, FIG. 3C illustrates a mirrored phase set 300' including cell versions 301A' and 301B'. Cell versions 301A' and 301B' are mirrored images of cell versions 301A and 301B (FIG. 3A), as demonstrated in part by the large arrow pointing in the opposite direction and the opposite phase assignments for right and left shifters. Similarly, FIG. 3D illustrates a mirrored phase set 310' including cell versions 311A' and 311B'. Cell versions 311A' and 311B' are mirrored images of cell versions 311A and 311B (FIG. 3B), as demonstrated by the large arrow pointing in the opposite direction (the phase of right and left shifters being the same). Note that the inclusion of the "'" associated with a cell/cell version designates that cell/cell version as a mirrored cell/cell image with its features and shifters therein flipped on a vertical axis.

Figure 5A:
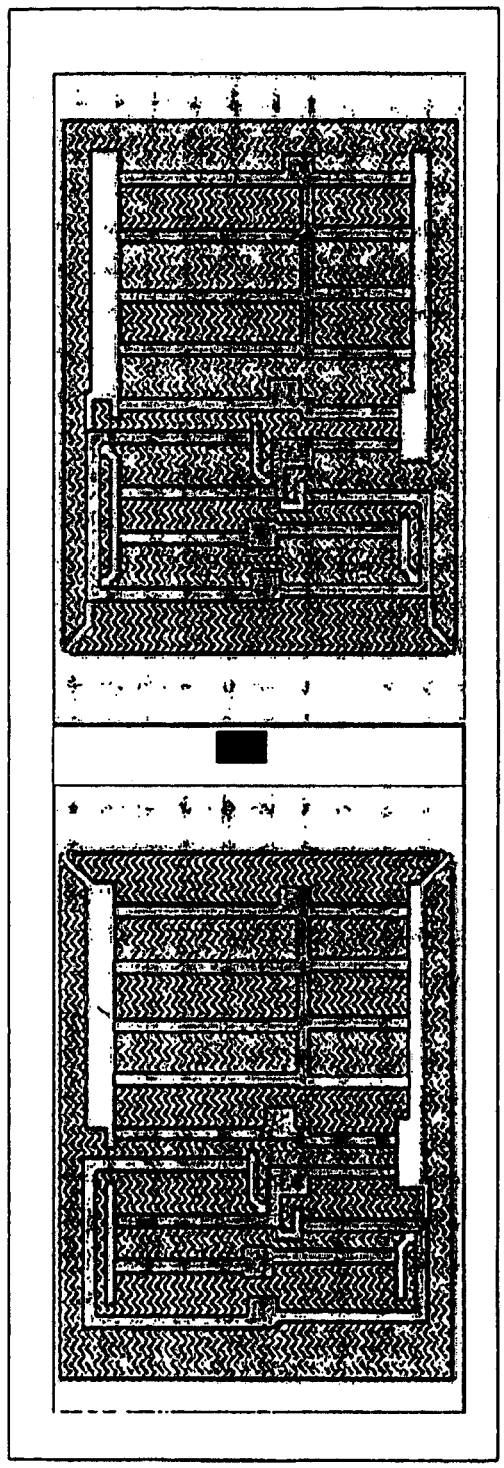
FIGS. 5A–5B illustrate exemplary standard cell phase sets with opposite and same phase assignments, respectively.
Figure 5B:
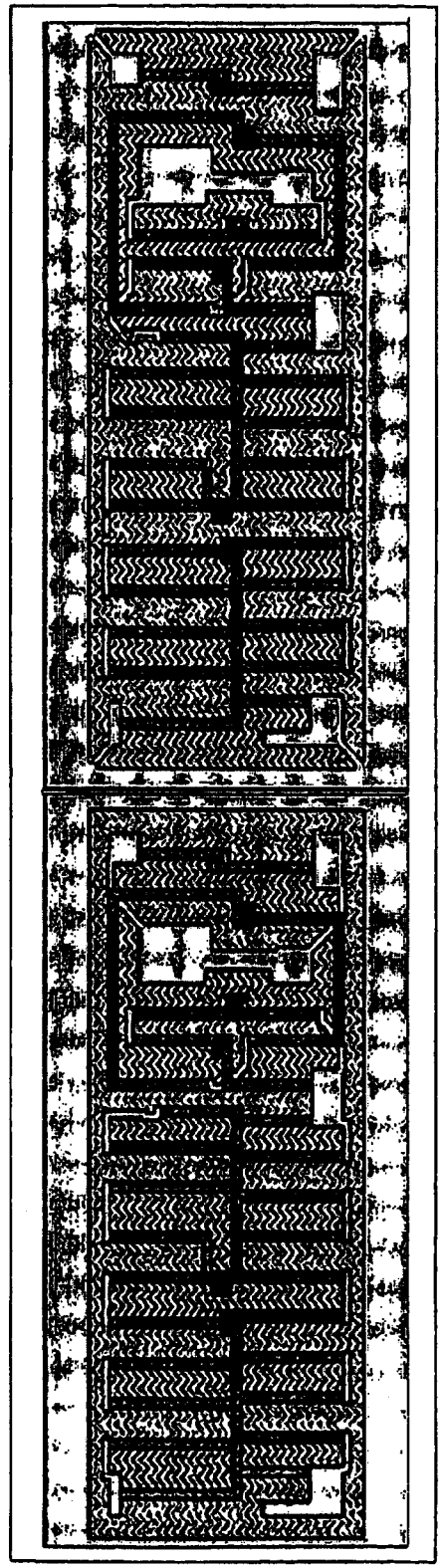

In accordance with one feature of the invention, the selection of which phase set, i.e. opposite phase set or same phase set, is included in the library can be based on phase conflicts. In some cells, only one phase set is acceptable, i.e. the other phase set can result in an undesirable phase conflict. For example, FIGS. 4A–4D illustrate three features 401, 402, and 403 in various full phase assignments. In FIGS. 4A and 4D, feature 401 is defined by shifters of the same phase, thereby resulting in a phase conflict. Therefore, the same phase set, i.e. 0/0 and 180/180, does not provide a valid conversion for a cell including features 401–403. However, the opposite phase phase set shown in FIGS. 4B and 4C can provide a valid phase assignment for features 401–403 (wherein all features are defined by shifters of opposite phase). FIGS. 5A and 5B illustrate more complex cells with their corresponding phase sets. In this case, FIG. 5A illustrates an opposite phase set and FIG. 5B illustrates a same phase set.

In the absence of phase conflict, the selection of either the opposite phase set or same phase set can be based on printability. In other words, simulations could be performed using both phase sets, wherein the phase set providing the better process latitude and/or image quality could be selected for inclusion in the cell library.

Figure 6C:
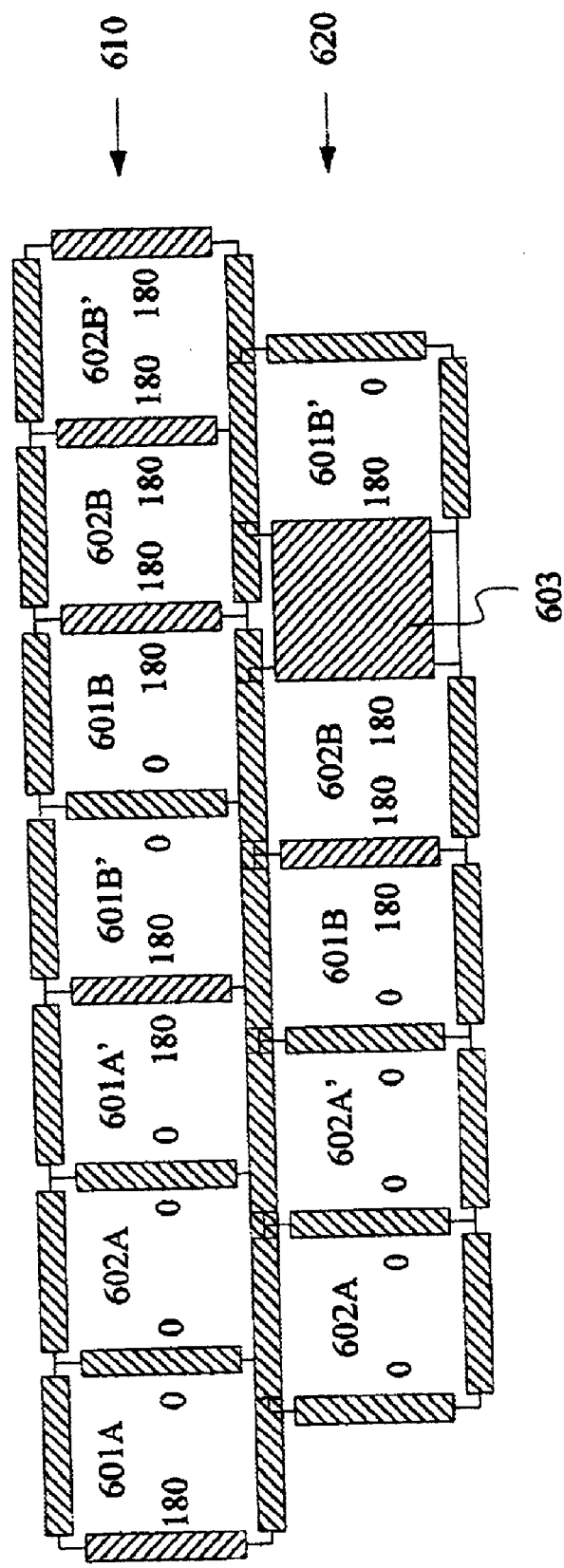
FIG. 6C illustrates the two exemplary rows of standard cells, each cell implemented with a cell version from a corresponding phase set.

FIGS. 6A–6C illustrate one implementation of building a design with standard cells including phase information. FIG. 6A illustrates a library 600 for building an exemplary design. Library 600 includes an opposite phase set for a generic cell 601 (including cell versions 601A and 601B) and a same phase set for a generic cell 602 (including cell versions 602A and 602B).

In accordance with one feature of the invention, a place-and-route tool can first build the design with generic cells 601 and 602 and their associated mirrored images, as shown in FIG. 6B. For example, a row 610 could be built with the following generic cells (left to right): 601, 602, 601', 601', 601, 602, and 602'. A row 620 (which need not, and, in fact, is not vertically aligned with the cells of row 610) could be built with the following generic cells (also left to right): 602, 602', 601, 602, a filler cell 603 (explained in further detail below), and 601'.

After the design is assembled, the appropriate phases can be "rippled", i.e. propagated, through the rows, as shown in FIG. 6C. For example, in row 610, assume that cell version 601A is selected to implement generic cell 601 (wherein cell version 601B could also be an equally valid selection). In this case, the design includes an abutting generic cell 602 to generic cell 601 (e.g. no filler cell is required). Therefore, the next cell version would have a 0 degree left shifter to match the 0 degree right shifter in the previously selected cell version 601A. The cell version for generic cell 602 providing the appropriate phase would be 602A. Therefore, cell version 602A can be selected. This selection then necessitates the next abutting cell version to have a 0 degree left shifter. Note that a mirrored generic cell, i.e. 601', has been initially placed. Therefore, the cell version for mirrored generic cell 601' providing the appropriate phase would be 601A'. Therefore, cell version 601A' can be selected. Subsequent cell versions in row 610 (as well as in row 620 and other rows (not shown)) can be selected in a similar manner.

In FIG. 6C, filler cell 603 could provide a predetermined phase (in this case, 180 degrees because the right shifter of cell 602B is assigned 180 degrees). In other embodiments, other filler cells could provide another phase or even features used for test, calibration, etc. In other embodiments, filler cells could have different phases on left/right edges. For example, in one standard cell library, filler cells having left/right edges with shifters having phases of 0/0, 0/180, 180/0, and 180/180 can be provided. In another standard cell library, filler cells having either a first phase set of 0/0 and 180/180 or a second phase set of 0/180 and 180/0 can be provided. In yet another embodiment, at least one filler cell includes a phase shifting region as well as a power rail that connects the power rails of adjacent cells. Note that if the filler cell includes the predetermined phase, this effectively increases the size of the shifters in the adjacent cells, thereby (at least in some cases) improving the resolution of the features therein. Further note that filler cells of different widths could also be provided. In yet another embodiment, a filler cell is not placed. In this case, the next cell version can be chosen from the appropriate phase set without limitations imposed by the previously selected cell version.

Figure 7:
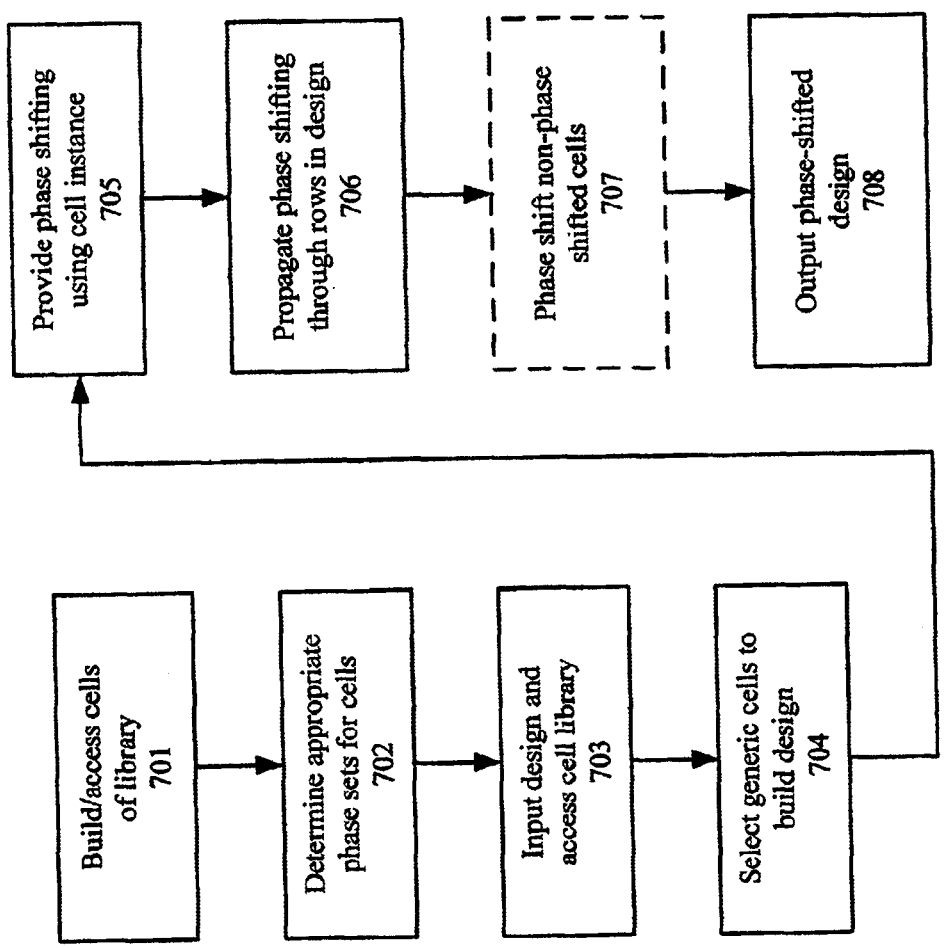
FIG. 7 illustrates one embodiment of a process flow for incorporating phase information into a cell-based design.

FIG. 7 illustrates one embodiment of a process flow for incorporating phase information into a cell-based design. In one embodiment, a full phase approach can be provided wherein substantially all of the features in the cell can be defined using shifters. In step 701, standard cells for a library can be built and/or accessed. This process includes receiving a description of the standard cell, e.g. a netlist, and defining a pattern that will provide the functionality required by the description in a standard cell format.

At least one phase set (i.e. same phase or opposite phase) can be identified as valid for a designated cell in step 702. This identification can be done by defining shifter shapes for the features as well as the edges of the standard cell and performing a phase assignment to determine the valid phase sets. In some implementations, shifter shape placement and phase assignment are performed as a single operation.

If multiple phase sets are valid, then the phase set that provides better lithographic performance can be selected for the designated cell. Phase sets for other cells can be identified in a similar manner. In one embodiment, the phase sets can be stored in a database for phase assignment and propagation. In another embodiment, the phase sets can be stored in the library itself. In either embodiment, a generic cell (wherein a generic cell refers to a designated standard cell including certain features therein without specific regard to phase assignment of such features) can reference its associated phase set.

In step 703, a user's design as well as the standard cell library with phase information can be accessed. Generic cells can then be selected to build the design in step 704. Note that the phase information associated with each cell can be transparent to the user. Therefore, building the design can be performed at this point with generic cells (and mirrored generic cells). When generic cells are used in step 704, existing place and route tools can be used without modifications and the phase information can be inserted from the generic cells at step 705 (discussed below) by a separate software tool. The phase information associated with cells of the design (i.e. the valid phase sets including the cell versions) can be stored as part of the GDS-II data of the input design (either using a different set of layers or in a different reference cell) or stored as a separate file.

After generic cell placement, phase assignment of a designated cell can be performed in step 705. In one embodiment, phase assignment can begin by selecting a cell version for a cell at the end of a row. Phase assignment can then be propagated to the other end of the row in step 706 using the steps described in reference to FIG. 6C. Specifically, particular cell versions can be selected based on previously selected cell versions. of importance, each phase set includes a valid cell version that can be used in the design. Cell versions in other rows can be selected in a similar manner.

In one embodiment, any areas of the layout that have not been phase shifted can be phase shifted in optional step 707. Note that manually designed regions of a layout can be used in conjunction with the pre-processed, i.e. phase-shifted cells. However, phase assignment of such manually designed regions of a layout will typically be performed either after place-and-route of the pre-processed cells or even after design sign-off, as in a standard process flow. Finally, in step 708, a phase-shifted design can be outputted.

In one embodiment, place-and-route tools can implement at least some of the above-described steps. For example, steps 701 and 702 could be performed by the abraCAD™ and/or iN-Phase™ tools, licensed by Numerical Technologies, Inc. Steps 703–704 could be performed by standard place and route tools from vendors such as Cadence Silicon Ensemble. Depending on the embodiment, step 705–706 can either be performed by suitably modified place and route software or by separate software, e.g. iN-Phase software or a point tool. Step 707 (and 708) can be performed using phase shifting tools, e.g. a suitably modified version of iN-Phase software designed to handle a layout where portions (e.g. the standard cells) have been previously phase shifted. The last tool can generate the final output (step 708). However, each intermediate tool may provide intermediate outputs with various degrees of the layout(s) phase shifted. Note that this same process could be performed post place-and-route or post-sign-off time. In one embodiment, standard cells could be identified and boundary shapes created with multiple solution sets. At this point, generic cells could be replaced with the new phased cells in a design.

Thus, in accordance with one feature of the invention, phase information can be incorporated into standard cells, wherein the actual phase assignment of such cells can be advantageously performed at any time after cell placement. This phase information advantageously has minimal impact on cell layout and place-and-route flow. Moreover, phase conflicts for such standard cells are eliminated or understood at the time of cell generation. Lastly, the final phase assignment can be performed in an extremely time efficient manner, thereby ensuring a commercially viable process.

The incorporation of phase information into standard design flow can be applied to various pitch-matched cell-based design methodologies. In other words, for efficient propagating of phase assignments, the cells can have horizontal edges that abut one another (and thus can be characterized as pitch-matched). Pitch-matched cells include, but are not limited to, data path, memory peripheral, and input/output pads. Note that cell width can vary significantly, e.g. 3 to 80 grids. Therefore, alignment in rows (rather than in the columns) is generally considered the critical constraint in standard cells (but not necessarily for other types of blocks).

In some designs, the placing of one or more double-height cells (which can provide more efficient drive output for a given area) would be desirable. (Note that in current standard cell libraries, double-height cells constitute less than 5% of the library.) In accordance with one feature of the invention, the double-height cell could include top and bottom shifters having the same predetermined phase as that for the other cells (e.g. 0 degrees). In one embodiment, at least one filler cell for at least one row could be placed adjacent the double-height cell, thereby ensuring proper phase assignment in the affected rows. In another embodiment, a predetermined border within the double-height cell can be formed, wherein features associated with that double-height cell are not placed between that border and the edges of the cell. In yet another embodiment, non-critical features associated with a double-height cell can be placed between the border and the outside of the cell and critical features are placed within the border.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. For example, some embodiments of the invention can include a computer program for defining a photolithographic mask, which transfers a target pattern to an integrated circuit. The computer program can include source code segments for performing some or all of the steps described in reference to FIG. 7. Other embodiments of the invention can include a system for designing a phase shifting mask (PSM) that transfers a pattern onto an integrated circuit. The system can at least include the means for accessing the library of standard cells including phase information. Other elements of the system could include the means for identifying and placing standard cells to implement the pattern as well as the means for propagating phase assignments along the row based on previously selected cell versions. Finally, the system and methods described herein can be applied to any lithographic process technology, including ultraviolet, deep ultraviolet (DUV), extreme ultraviolet (EUV), x-ray, electron projection lithography (EPL), and ebeam.

What is claimed is:

1. A method of designing standard cells for phase compliance, the method comprising:
   receiving a description of a standard cell;
   defining features to implement the description;
   providing at least two cell versions of the standard cell, wherein each cell version includes shifter shapes and phase information regarding the features of the standard cell; and
   associating the cell versions with the standard cell.

2. The method of claim 1, wherein associating includes storing the cell versions with the standard cell.

3. The method of claim 1, wherein associating includes storing the cell versions separately from the standard cell.

4. The method of claim 1, wherein each cell version includes four edges, a first pair of opposing edges in the four edges have shifters of a predetermined phase, and wherein a second pair of opposing edges have shifters of either (i) two different phases or (ii) same phases.

5. The method of claim 1, further including providing a mirrored cell image for each cell version, wherein the mirrored cell image flips contents of the cell version on a predetermined axis.

6. The method of claim 1, wherein horizontal edges of each standard cell have shifters of a same phase.

7. The method of claim 6, wherein vertical edges of each standard cell have shifters of opposite phases or a same phase.

8. A standard cell library comprising:
   a plurality of standard cells, at least one standard cell in the plurality of standard cells comprised of at least one of a first phase set and a second phase set,
   wherein the first phase set includes two cell versions, each cell version having first opposite edges with shifters of a fixed phase and second opposite edges with shifters of a same phase, and
   wherein the second phase set includes two cell versions, each cell version having first opposite edges with shifters of a fixed phase and second opposite edges with shifters of opposite phases.

9. The standard cell library of claim 8, wherein contents of each cell version can be flipped on a predetermined axis, thereby providing a mirrored cell image.

10. The standard cell library of claim 8, further including at least one filler cell, the filler cell providing a predetermined phase.

11. A method of designing an integrated circuit, the method comprising:
   receiving a design for the integrated circuit;
   accessing a library of standard cells, wherein a first group of standard cells in the library of standard cells includes phase information, the phase information including valid phase sets based on the first group of standard cells, each of the valid phase sets comprising at least two cell versions corresponding to one of the first group of standard cells, each of the at least two cell versions indicating a phase for a shifter on each edge of the standard cell;
   identifying a second group of standard cells from the first group of standard cells to implement the design;
   placing the second group of standard cells to implement the design as an implemented pattern; and
   selecting one of the at least two cell versions for each of the second group of standard cells in the implemented pattern.

12. The method of claim 11, wherein the one of the at least two cell versions comprises one of
   a first cell version including horizontal edges having shifters of a predetermined phase, a left vertical edge having a shifter of a first phase, and right vertical edge having a shifter of a second phase,
   the second cell version including horizontal edges having shifters of the predetermined phase, a left vertical edge having a shifter of the second phase, and a right vertical edge having a shifter of the first phase,
   the third cell version including horizontal edges having shifters of the predetermined phase, a left vertical edge having a shifter of the first phase, and a right vertical edge having a shifter of the first phase, and
   the fourth cell version including horizontal edges having shifters of the predetermined phase, a left vertical edge having a shifter of the second phase, and a right vertical edge having a shifter of the second phase,
   wherein the first and second cell versions form a first valid phase set and the third and fourth cell versions form a second valid phase set.

13. The method of claim 12, wherein the predetermined phase includes one of the first and second phases.

14. The method of claim 11, further including:
   placing at least one filler cell in the second group of standard cells to implement the pattern.

15. The method of claim 14, wherein each filler cell includes a phase region that matches a shifter in an adjacent cell version.

16. The method of claim 11, wherein placing the second group of standard cells includes:
   mirroring contents of at least one standard cell.

17. The method of claim 11, further including outputting a phase-shifted design for the integrated circuit.

18. A method of designing a phase shifting mask (PSM), the method comprising: receiving a design;
   accessing a library of standard cells including phase information, the phase information including at least two cell versions for each standard cell in the library of standard cells, a cell version indicating a phase for a shifter associated with each edge of the standard cell;
   identifying standard cells to implement the design;
   placing the identified standard cells in rows to implement the design;
   selecting a cell version for an identified standard cell at an end of a row;
   propagating phase assignments along the row based on previously selected cell versions;
   repeating the steps of selecting and propagating for each row; and
   outputting a phase-shifted design for the PSM.

19. The method of claim 18, further including placing a filler cell in at least one row, wherein a phase of the filler cell matches an abutting phase shifter in an adjacent cell version.

20. The method of claim 18, wherein placing the identified standard cells includes:
mirroring contents of at least one standard cell.

21. A standard cell for designing an integrated circuit, the standard cell including:
vertical edges having associated left/right shifters;
horizontal edges having associated top/bottom shifters; and
at least one phase-shifted feature.

22. The standard cell of claim 21, wherein the top/bottom shifters have a same phase.

23. The standard cell of claim 22, wherein the left/right shifters have one of 0 degrees/0 degrees, 180 degrees/180 degrees, 0 degrees/180 degrees, and 180 degrees/0 degrees.

24. The standard cell of claim 22, wherein the left/right shifters have $\theta$ degrees/$\theta$ degrees, $\theta$+180 degrees/$\theta$ 180 degrees, $\theta$ degrees $\theta$+180 degrees, and $\theta$+180 degrees/$\theta$ 180 degrees, respectively.

25. The standard cell of claim 21, wherein a measurement between an end of a top/bottom shifter and a vertical edge is one of greater than ½ separation and 0 separation, wherein separation refers to a minimum distance required between two shifters on a photolithographic mask used to fabricate an integrated circuit.

26. The standard cell of claim 21, wherein a measurement between an end of a vertical shifter and a horizontal edge is a sum of ½ dimension and 1 separation,
wherein dimension refers to a minimum dimension required for any shifter, and
wherein separation refers to a minimum distance required between two shifters on a photolithographic mask used to fabricate the integrated circuit.

27. The standard cell of claim 21, wherein a measurement between a horizontal edge and a horizontal shifter edge extending beyond the horizontal edge is ½ dimension, wherein dimension refers to a minimum dimension required for any shifter.

28. The standard cell of claim 21, wherein a measurement between a vertical edge and a vertical shifter edge extending beyond the vertical edge is at least ½ dimension, wherein dimension refers to a minimum dimension required for any shifter.

29. The standard cell of claim 21, wherein an amount by which any shifter can extend from an edge into the standard cell is a predetermined dimension.

30. A computer program for defining a photolithographic mask, the computer program including:
a source code segment for receiving a design;
a source code segment for accessing a library of standard cells, the library including a first group of standard cells with phase information, the phase information including valid phase sets based on the first group of standard cells, each of the valid phase sets including two or more cell versions;
a source code segment for identifying a second group of standard cells from the library to implement the design;
a source code segment for placing the second group of standard cells to implement the design; and
a source code segment for selecting one of the two or more cell versions from the valid phase sets for each placed standard cell, the one of the two or more cell versions indicating a phase for a shifter on each edge of the standard cell.

31. A system for designing a phase shifting mask (PSM), the system comprising:
means for receiving a design;
means for accessing a library of standard cells including phase information, the phase information including at least two cell versions for each standard cell, wherein a cell version indicates a phase for a shifter associated with each edge of the standard cell;
means for identifying standard cells to implement the design;
means for placing the identified standard cells in rows to implement the design;
means for selecting a cell version for an identified standard cell at an end of a row;
means for propagating phase assignments along the row based on previously-selected cell versions;
means for repeating the steps of selecting and propagating for each row; and
means for outputting a phase-shifted design for the PSM.

* * * * *